(12) United States Patent
Jung et al.

(10) Patent No.: US 12,206,021 B2
(45) Date of Patent: Jan. 21, 2025

(54) NEGATIVE DIFFERENTIAL RESISTANCE DEVICE

(71) Applicant: SAMSUNG ELECTRONICS CO., LTD., Suwon-si (KR)

(72) Inventors: Kilsu Jung, Suwon-si (KR); Jin-Hong Park, Hwaseong-si (KR); Keun Heo, Yongin-si (KR); Sungjun Kim, Incheon (KR)

(73) Assignees: SAMSUNG ELECTRONICS CO., LTD. (KR); RESEARCH & BUSINESS FOUNDATION SUNGKYUNKWAN UNIVERSITY (KR)

( * ) Notice: Subject to any disclaimer, the term of this patent is extended or adjusted under 35 U.S.C. 154(b) by 61 days.

(21) Appl. No.: 18/307,914

(22) Filed: Apr. 27, 2023

(65) Prior Publication Data

US 2024/0079496 A1 Mar. 7, 2024

Related U.S. Application Data

(63) Continuation of application No. 17/338,400, filed on Jun. 3, 2021, now Pat. No. 11,670,714.

(30) Foreign Application Priority Data

Sep. 23, 2020 (KR) ........................ 10-2020-0122860

(51) Int. Cl.
*H01L 29/78* (2006.01)
*H01L 29/267* (2006.01)
(Continued)

(52) U.S. Cl.
CPC ...... *H01L 29/78391* (2014.09); *H01L 29/267* (2013.01); *H01L 29/45* (2013.01);
(Continued)

(58) Field of Classification Search
CPC .............. H01L 29/516; H01L 29/7391; H01L 29/7606; H01L 29/78391; H01L 51/0525; H01L 51/0545
See application file for complete search history.

(56) References Cited

U.S. PATENT DOCUMENTS

| 5,552,624 A | 9/1996 | Skotnicki et al. |
| 6,563,185 B2 | 5/2003 | Moddel et al. |

(Continued)

FOREIGN PATENT DOCUMENTS

| JP | H0677559 A | 3/1994 |
| JP | H10125797 A | 5/1998 |

(Continued)

OTHER PUBLICATIONS

Shim, J. , et al., "Phosphorene/rhenium disulfide heterojunction-based negative differential resistance device for multi-valued logic. ", Nat Commun 7, 13413 (2016).

*Primary Examiner* — Raj R Gupta
(74) *Attorney, Agent, or Firm* — Myers Bigel, P.A.

(57) ABSTRACT

A negative differential resistance device includes a dielectric layer having a first surface and a second surface opposing the first surface, a first semiconductor layer that includes a first degenerated layer that is on the first surface of the dielectric layer and has a first polarity, a second semiconductor layer that includes a second degenerated layer that has a region that overlaps the first semiconductor layer and has a second polarity, a first electrode electrically connected to the first semiconductor layer, a second electrode electrically connected to the second semiconductor layer, and a third electrode on the second surface of the dielectric layer and which has a region overlapping at least one of the first semiconductor layer or the second semiconductor layer.

20 Claims, 7 Drawing Sheets

(51) Int. Cl.
*H01L 29/45* (2006.01)
*H01L 29/51* (2006.01)
*H01L 29/76* (2006.01)
*H10K 10/46* (2023.01)
*H10K 10/84* (2023.01)

(52) U.S. Cl.
CPC ........ *H01L 29/516* (2013.01); *H01L 29/7606* (2013.01); *H10K 10/466* (2023.02); *H10K 10/472* (2023.02); *H10K 10/84* (2023.02)

(56) References Cited

U.S. PATENT DOCUMENTS

| | | | |
|---|---|---|---|
| 6,686,631 | B1 | 2/2004 | King et al. |
| 7,012,833 | B2 | 3/2006 | King |
| 8,785,912 | B2 | 7/2014 | Chung et al. |
| 9,293,546 | B2 | 3/2016 | Pillarisetty |
| 11,437,572 | B2 * | 9/2022 | Park ........................ H10B 63/84 |
| 2006/0125017 | A1 | 6/2006 | Liu |
| 2007/0120186 | A1 | 5/2007 | Lu et al. |
| 2010/0127243 | A1 | 5/2010 | Banerjee et al. |
| 2015/0207485 | A1 * | 7/2015 | Hsu ........................... H03H 7/06 333/172 |
| 2018/0158913 | A1 * | 6/2018 | Withers ................ H05B 33/145 |
| 2018/0358412 | A1 * | 12/2018 | Park ........................ H10N 80/107 |
| 2018/0358446 | A1 | 12/2018 | Park et al. |
| 2019/0097014 | A1 | 3/2019 | Lee et al. |
| 2020/0194557 | A1 * | 6/2020 | Zhu ........................ H01L 29/516 |
| 2021/0005710 | A1 * | 1/2021 | Park ................. H01L 29/42312 |

FOREIGN PATENT DOCUMENTS

| | | |
|---|---|---|
| KR | 20170109457 A | 9/2017 |
| KR | 20180135350 A | 12/2018 |
| KR | 20190012050 A | 2/2019 |

* cited by examiner

NEGATIVE DIFFERENTIAL RESISTANCE DEVICE

CROSS-REFERENCE TO RELATED APPLICATION(S)

This application is a continuation of U.S. patent application Ser. No. 17/338,400 filed Jun. 3, 2021, which application claims benefit of priority to Korean Patent Application No. 10-2020-0122860, filed on Sep. 23, 2020, in the Korean Intellectual Property Office, the disclosures of which are incorporated herein by reference in their entireties.

BACKGROUND

1. Field

The present disclosure relates to a negative differential resistance device.

2. Description of Related Art

A negative differential resistance device may configure a multi-valued logic circuit through an N-shaped current characteristic. Further, the negative differential resistance device may reduce static power consumption through a reduction in an area occupied by a connection wire by reducing a number of elements. However, there is a limit to increasing a number of states of the multi-valued logic circuits using only a single peak of the negative differential resistance device.

In order to solve this problem, a number and a position of the peaks are adjusted by increasing a number of multi-valued logic elements or adding a circuit-required resistance. This, however, has acted as an obstacle to miniaturization of the element itself as well as a surface area of an entire circuit. Further, such difficulty of miniaturization/integration have been problematic in terms of power consumption.

SUMMARY

Various embodiments of the present disclosure may provide a negative differential resistance device that is configured to change positions of a peak current value and a valley current value.

Some embodiments of the present disclosure may provide a negative differential resistance device having a plurality of peak current values and valley current values.

According to some embodiments of the present disclosure, a negative differential resistance device may include a dielectric layer with a first surface and a second surface, opposing the first surface, a first semiconductor layer that includes a first degenerated layer that is on the first surface of the dielectric layer and has a first polarity, a second semiconductor layer that includes a second degenerated layer that has a region that overlaps the first semiconductor layer and has a second polarity, a first electrode electrically connected to the first semiconductor layer, a second electrode electrically connected to the second semiconductor layer, and a third electrode on the second surface of the dielectric layer and which has a region that overlaps at least one of the first semiconductor layer or the second semiconductor layer.

According to some embodiments of the present disclosure, a negative differential resistance device may include a dielectric layer that has a first surface and a second surface opposing the second surface. The dielectric layer includes a plurality of regions in parallel to one another. The negative differential resistance device includes a first semiconductor layer including a first degenerated layer that is on the first surface of the dielectric layer, overlaps each of the plurality of regions, and has a first polarity, a second semiconductor layer including a second degenerated layer that is on the first surface of the dielectric layer, overlaps each of the plurality of regions, and has a region connected to the first semiconductor layer, a first electrode connected to an end of one side of the first semiconductor layer, a second electrode connected to an end of one side of the second semiconductor layer, and a plurality of third electrodes on the second surface of the dielectric layer. The plurality of third electrodes overlap at least one of the first semiconductor layer or second semiconductor layer.

According to some embodiments of the present disclosure, a negative differential resistance device may include a dielectric layer that includes a first surface and a second surface opposing the first surface, first and second semiconductor layers on the first surface of the dielectric layer and having first and second polarities, respectively. The second semiconductor layer includes a region overlapping the first semiconductor layer. The negative differential resistance device includes a first electrode connected to the semiconductor layer, a second electrode spaced apart from the first electrode and in contact with the second semiconductor layer. The second electrode is spaced apart from the first electrode. The negative differential resistance device includes a plurality of third electrodes on the second surface in parallel with one another and overlapping at least one of the first semiconductor layer or the second semiconductor layer, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinbelow, various example embodiments of the present disclosure will be described in detail with reference to the accompanying drawings.

Figure 1:
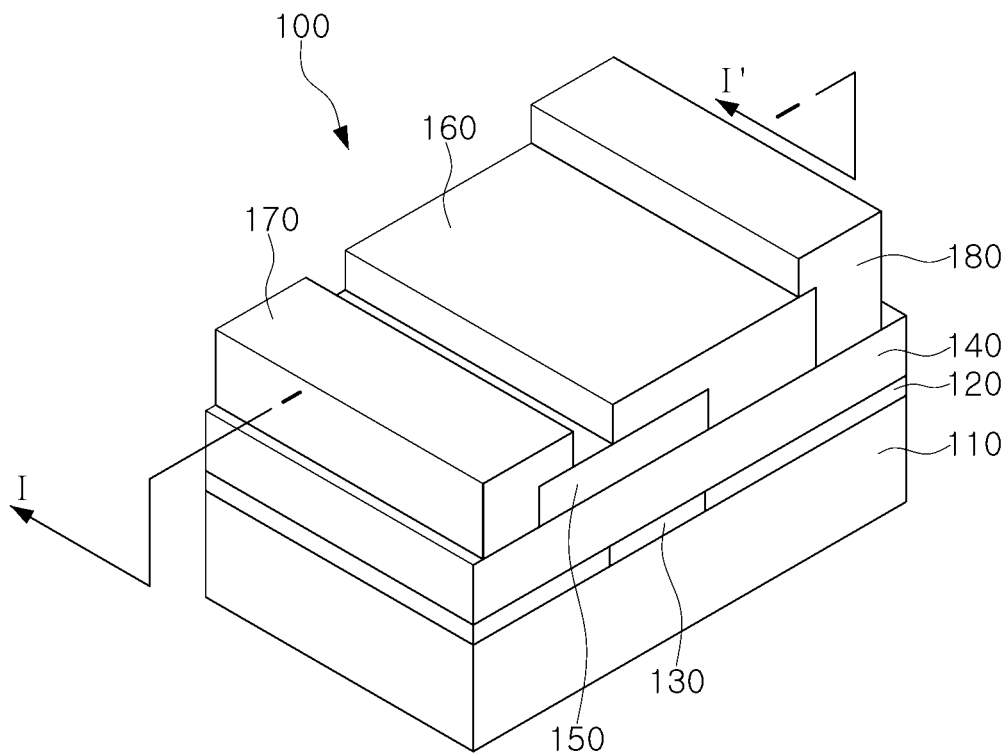
FIG. 1 is a planar view schematically illustrating a negative differential resistance device according to example embodiments of the present disclosure.
Figure 2A:
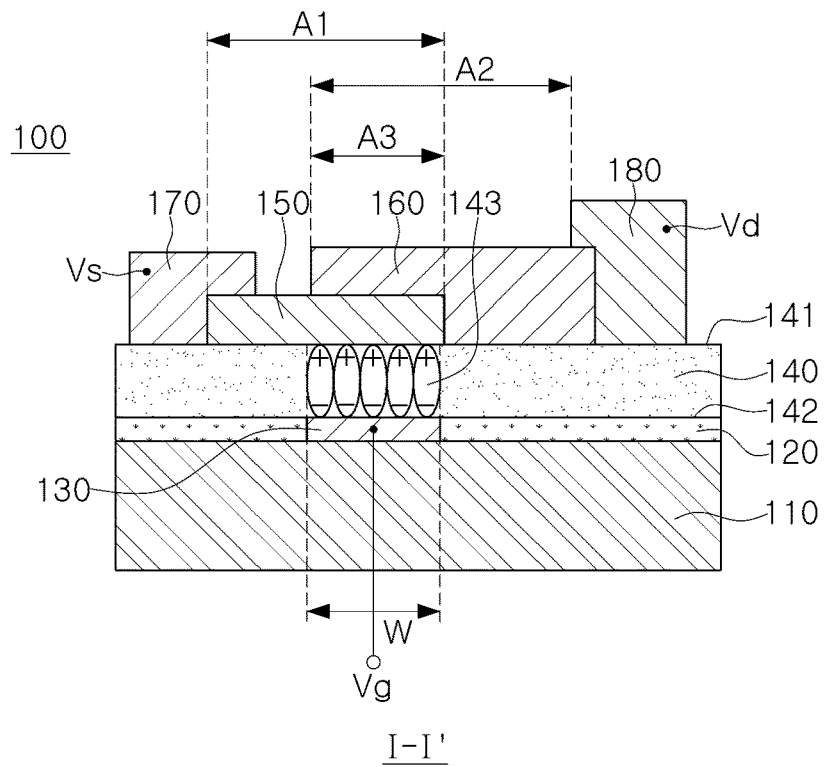
FIG. 2A is a side cross-sectional view taken along line I-I' of the negative differential resistance device of FIG. 1.
Figure 2B:
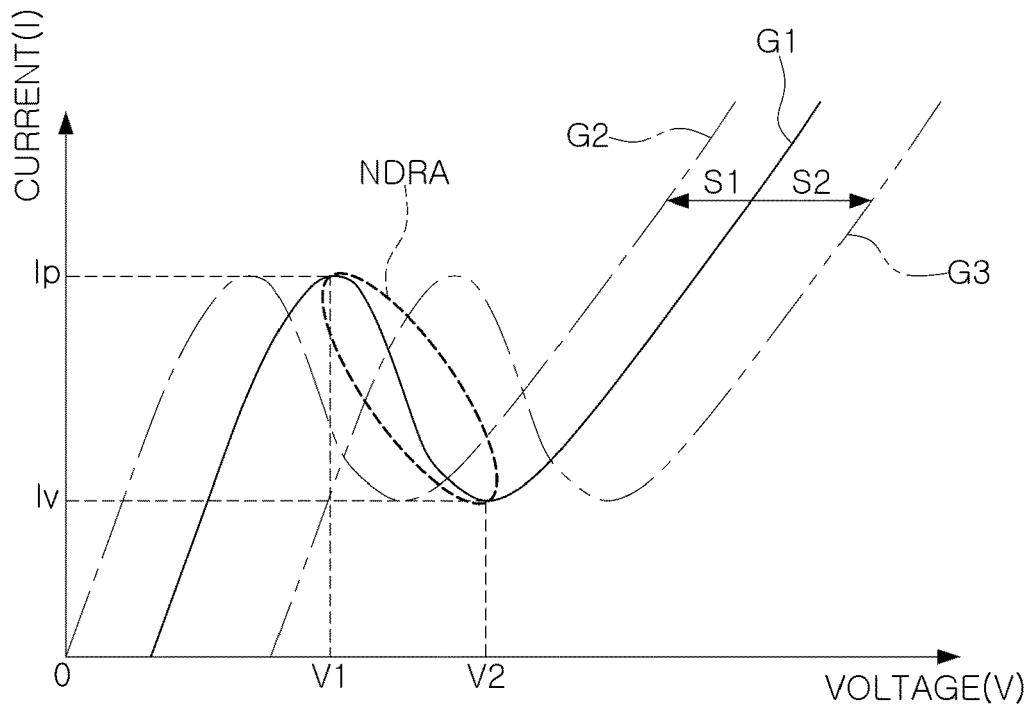
FIG. 2B is a graph illustrating voltage-current characteristics of the differential resistance device of FIG. 1.

Referring to FIGS. 1, 2A and 2B, a negative differential resistance device according to example embodiments will be described.

FIG. 1 is a planar view schematically illustrating a negative differential resistance device according to example embodiments of the present disclosure. FIG. 2 is a side cross-sectional view taken along line I-I' of FIG. 1, and FIG. 2B is a graph illustrating voltage-current characteristics of the differential resistance device of FIG. 1.

Referring to FIG. 1, a negative differential resistance device 100 according to example embodiments may include a dielectric layer 140, a first semiconductor layer 150, a second semiconductor layer 160 and first to third electrodes 170, 180 and 130. In addition, depending on example embodiments, a support substrate 110 may further be disposed on a lower portion of the third electrode 130, and an insulating layer 120 may further be disposed between the dielectric layer 140 and the support substrate 110. The support substrate 110 may be a conductive substrate. Therefore, the first semiconductor layer 150, the second semiconductor layer 160 and the dielectric layer 140 are disposed on the support substrate 110 to prevent damage of the first semiconductor layer 150, the second semiconductor layer 160 and the dielectric layer 140, and apply power to the third electrode 130 through the support substrate 110.

Referring to FIG. 2A, the dielectric layer 140 may have a first surface 141 and a second surface 142 located in an opposite direction. The dielectric layer 140 may be formed of a dielectric material or a ferroelectric material in the dielectric material depending on example embodiments.

The dielectric materials may include at least one of silicon oxide, aluminum oxide, titanium oxide, and hexagonal boron nitride (hBN). In particular, when the dielectric layer 140 is formed of hBN, the dielectric layer 140 can be plasma-treated to increase a doping concentration.

The ferroelectric materials may include at least one of, for example, hafnium oxide, hafnium zirconium oxide, zirconium oxide, barium strontium titanium oxide, barium titanium oxide and/or lead zirconium titanium oxide. At this time, hafnium zirconium oxide may be a material in which zirconium (Zr) is doped in hafnium oxide or a compound of hafnium (Hf), zirconium (Zr) and oxygen (O). In some embodiments, a case in which the dielectric layer 140 formed of a ferroelectric material is described as an example.

A first semiconductor layer 150 may be disposed in a first region A1 on the first surface 141 of the dielectric layer 140. In addition, a second semiconductor layer 160 may be disposed in a second region A2. A partial region A3 of the first region A1 may overlap the second region A2. That is, a partial region of the second semiconductor layer 160 may be disposed to overlap a top of the first semiconductor layer 150, but is not limited thereto. Depending on example embodiments, side surfaces of the second semiconductor layer 160 and the first semiconductor layer 150 are disposed to be in contact with each other so that an upper surface of the second semiconductor layer 160 is in the same level as that of the first semiconductor layer 150, with respect to the support substrate 110. A source voltage Vs and a drain voltage Vd may be applied to the first and second semiconductor layers 150 and 160 through the first electrode 170 and the second electrode 180, respectively.

The first semiconductor layer 150 has a first polarity and may be a degenerated semiconductor layer. The second semiconductor layer 160 has a second polarity different from the first polarity and may be a degenerated semiconductor layer. As used herein, the expression "degenerated semiconductor layer" refers to a semiconductor layer heavily doped with respect to a polarity thereof. The first and second semiconductor layers 150 and 160 may be p-type and n-type semiconductor layers, respectively, or n-type and p-type semiconductor layers, respectively. The p-type semiconductor layer may be formed of at least one of silicon (Si), germanium (Ge), III-V group semiconductor, organic semiconductor, oxide semiconductor, transition metal chalcogenide and phosphorene, but is not limited thereto. The n-type semiconductor layer may be formed of at least one of silicon (Si), germanium (Ge), III-V group semiconductor, organic semiconductor, oxide semiconductor, transition metal chalcogenide and disulfide ($ReS_2$), but is not limited thereto. In some example embodiments, a case in which the first semiconductor layer 150 is formed of rhenium disulfide, and the second semiconductor layer 160 is formed of phosphorene is described.

A first electrode 170 may be coupled to an end of one side of the first semiconductor layer 150. In some embodiments, a partial region of the first electrode 170 may be directly in contact with the first surface 141 of the dielectric layer 140, depending on example embodiments. The first electrode 170 may be formed of at least one of titanium (Ti), aluminum (Al), erbium (Er), platinum (Pt), gold (Au) and/or palladium (Pd), but is not limited thereto.

The second electrode 180 may be coupled to an end of one side of the second semiconductor layer 160. The partial region of the second electrode 180 may be directly in contact with the first surface 141 of the dielectric layer 140, depending on example embodiments. The second electrode 180 may be formed of at least one of titanium (Ti), aluminum (Al), erbium (Er), platinum (Pt), gold (Au) and/or palladium (Pd), but is not limited thereto.

The third electrode 130 may be disposed on the second surface 142 of the dielectric layer 140. The third electrode 130 may be a type of gate electrode for forming a channel region 143 on the dielectric layer 140.

Figure 3:
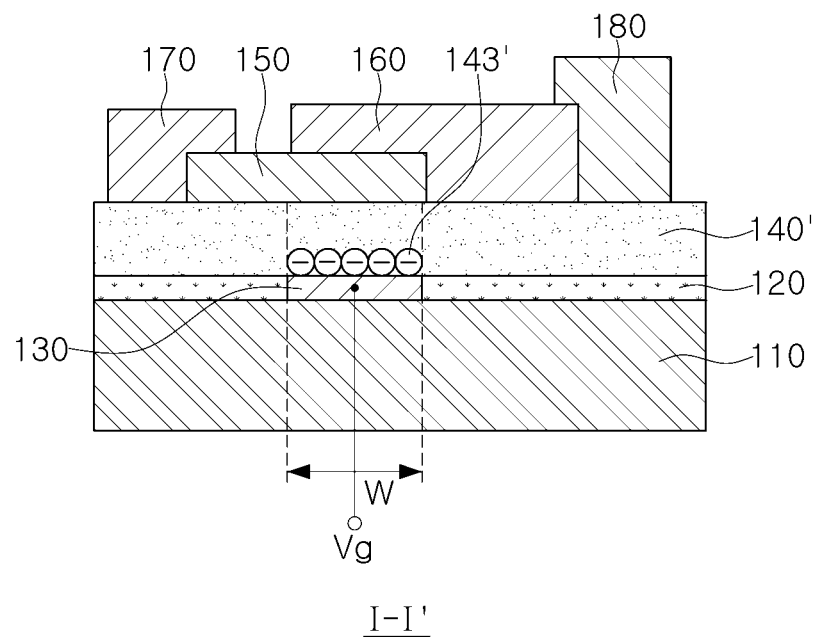
FIG. 3 is a side cross-sectional view of a negative differential resistance according to example embodiments of the present disclosure.

As shown in FIG. 2A, when the dielectric layer 140 is formed of a ferroelectric material, a polarity of spontaneous polarization may be reversed and arranged in the channel region 143. Further, as shown in FIG. 3, when a dielectric layer 140' is formed of a dielectric material, a positive or negative charge may be trapped in accordance with a polarity of a voltage applied through the third electrode 130 in a channel region 143'.

Figure 4:
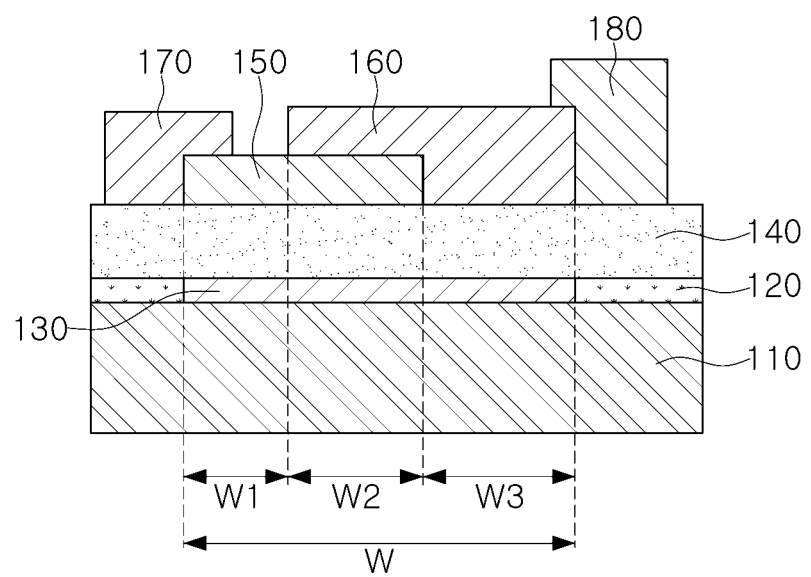
FIG. 4 is a modified example of a negative differential resistance according to example embodiments of the present disclosure.

Referring to FIG. 2A, a width of the channel region 143 formed on the dielectric layer 140 may be controlled by adjusting a width W of the third electrode 130. The third electrode 130 may be disposed to overlap the first semiconductor layer 150 and/or the second semiconductor layer 160. Referring to FIG. 4, a width W of the third electrode 130 may be disposed to include at least one of a first sub-region W1, a second sub-region W2 and a third sub-region W3 of the region in contact with the first semiconductor layer 150 and the second semiconductor layer 160. The first sub-region W1 is in an area in which the third electrode 130 is overlapped with the first semiconductor layer 150, but not the second semiconductor layer 160. The second sub-region W2 is in an area in which the third electrode 130 is overlapped with both the first semiconductor layer 150 and the second semiconductor layer 160. The third sub-region W3 is in an area in which the third electrode 130 is overlapped with the second semiconductor layer 160, but not the first semiconductor layer 150. The third electrode 130 may be formed to include any one of the first to third sub-regions A1 to A3, two regions of the first to third sub-regions A1 to A3 or all sub-regions of the first to third sub-regions A1 to A3.

The insulating layer 120 may be disposed in a region of the second surface 142, in which the third electrode 130 of the dielectric layer 140 is not disposed, thereby preventing the dielectric layer 140 from contacting the support substrate 110.

The negative differential resistance device 100 having such a configuration may shift a current-voltage characteristic curve of the negative resistance device 100 by adjusting a voltage applied to the third electrode 130. This will be described with reference to FIGS. 2A and 2B.

Referring to FIGS. 2A and 2B, when the source voltage Vs and the drain voltage Vd are applied through the first electrode 170 and the second electrode 180 of the negative differential resistance device 100, the negative differential resistance device 100 may have a current-voltage characteristic having a negative differential resistance area (NDRA).

Referring to FIG. 2B, the negative differential resistance device 100, in contrast to a conventional resistance device, may have a negative differential resistance area (NDRA) in which a current I is reduced despite an increase in a voltage V. That is, the negative differential resistance area (NDRA) is a region in which a voltage value increases from V1 to V2, but a current value is reduced from a peak current value Ip to a valley current value Iv. A position on the current-voltage characteristic curve G1, at which the negative differential resistance area (NDRA) occurs, is determined according to physical properties of the first semiconductor layer 150 and the second semiconductor layer 160, and the negative differential resistance device has a current-voltage characteristic having only one peak current value Ip and one valley current value Iv. Therefore, positions of the peak current value Ip and the valley current value Iv of the negative differential resistance device are fixed values which cannot be changed without changing materials, concentrations, and/or amounts of the first semiconductor layer 150 and the second semiconductor layer 160.

In some example embodiments, the positions of the peak current value Ip and the valley current value Iv of the current-voltage characteristic curve G1 may be adjusted without changing the materials of the first and second semiconductor layers 150 and 160, by disposing the first semiconductor layer 150 and the second semiconductor layer 160 on the first surface 141 of the dielectric layer 140 and disposing the third electrode 130 capable of adjusting the width of the channel region 143 on the second surface 142 of the dielectric layer 140. By adjusting a gate voltage Vg applied through the third electrode 130, the current-voltage characteristic curve G1 may be shifted to another current-voltage characteristic curves G2 and G3.

For example, as shown in FIGS. 2A and 2B, in the case in which the dielectric layer 140 is formed of a ferroelectric material, polarity-reversed spontaneous polarization increases in the channel region 143 increases as the gate voltage Vg increases to have a positive (+) value. Accordingly, the current-voltage characteristic curve G1 shifts toward an S1 direction and moves to another current-voltage characteristic curve G2. In addition, as the gate voltage Vg decreases to have a negative (−) value, the polarity-reversed spontaneous polarization is reduced in the channel region 143. Therefore, the current-voltage characteristic curve G1 shifts toward an S2 direction and moves to another current-voltage characteristic curve G3.

For example, as shown in FIG. 3, in the case in which the dielectric layer 140 is formed of a dielectric material, a number of electrons trapped in the channel region 143 increases as the gate voltage Vg increases have a positive (+) value. Accordingly, the current-voltage characteristic curve G1 shifts toward the S1 direction and moves to another current-voltage characteristic curve G2. Further, as the gate voltage Vg decreases have a negative (−) value, a number of holes trapped in the channel region 143 increases. Therefore, the current-voltage characteristic curve G1 shifts toward the S2 direction and moves to another current-voltage characteristic curve G3. Accordingly, the current-voltage characteristic curve G1 of the negative differential resistance device 100 may be changed by controlling the gate voltage Vg applied through the third electrode 130.

Figure 5:
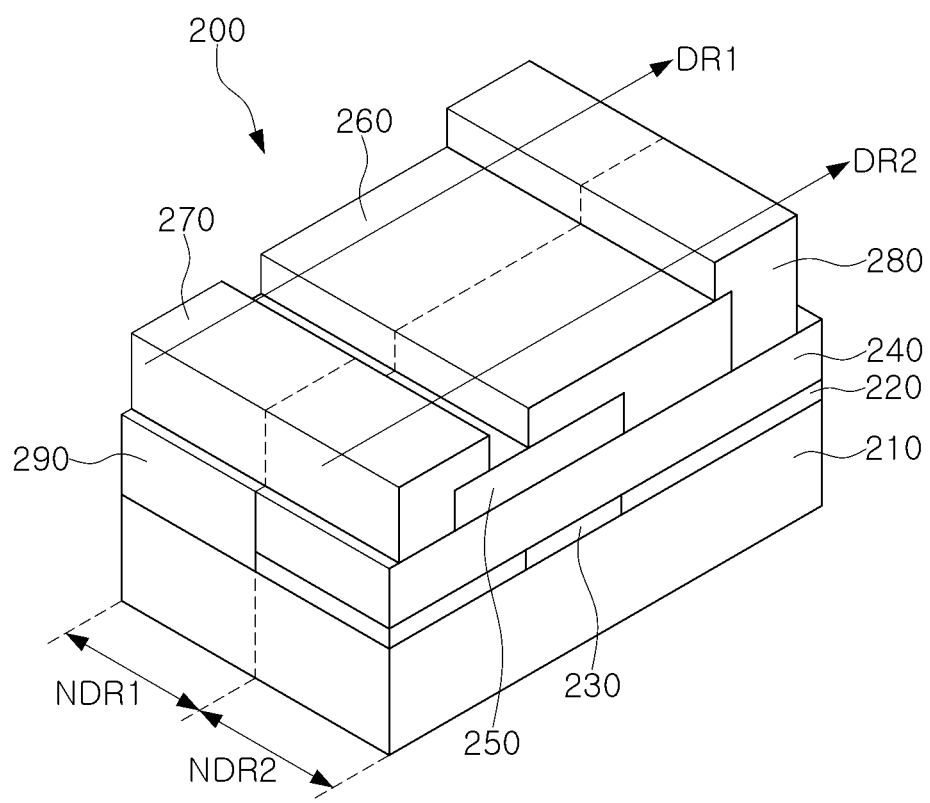
FIGS. 5, 7 and 8 are diagrams illustrating various embodiments of a negative differential resistance device according to example embodiments of the present disclosure.
Figure 6A:
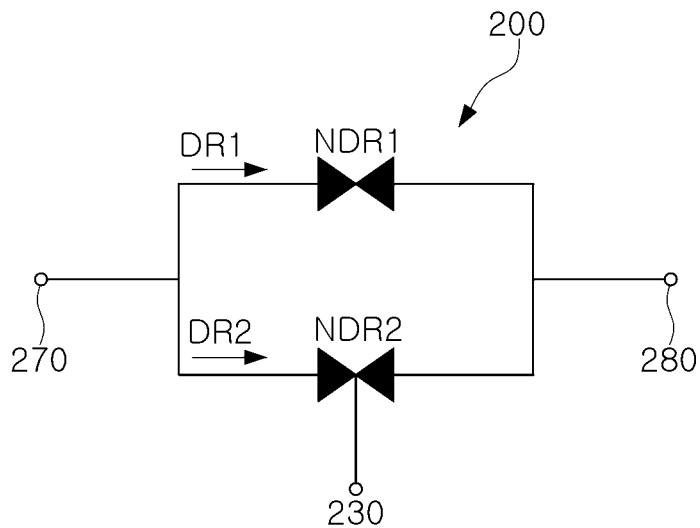
FIG. 6A is a circuit diagram of the negative differential resistance device of FIG. 5.
Figure 6B:
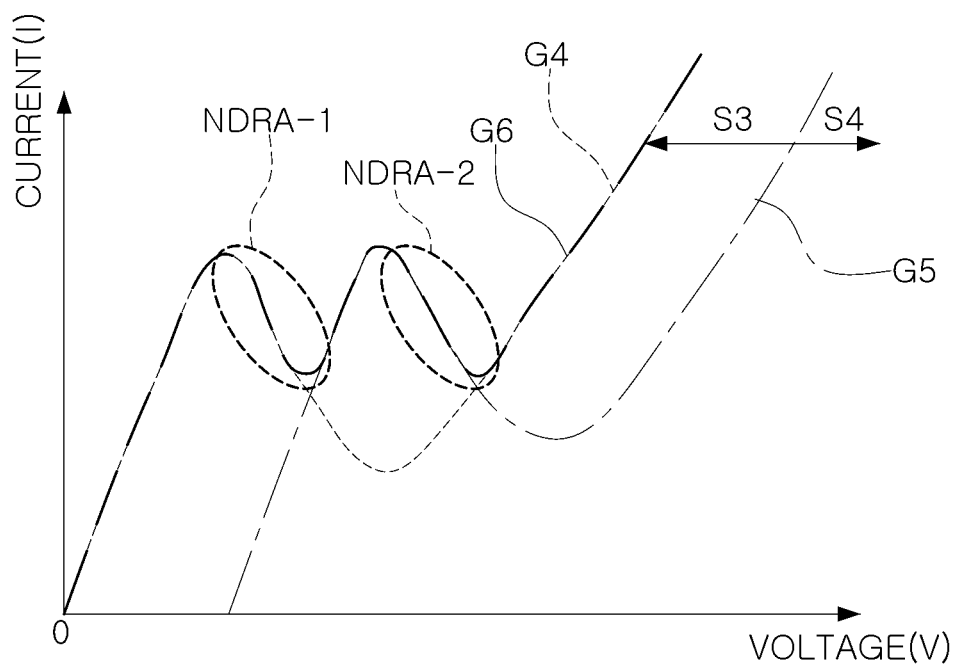
FIG. 6B is a graph illustrating voltage-current characteristics of the negative differential resistance device of FIG. 5.
Figure 7:
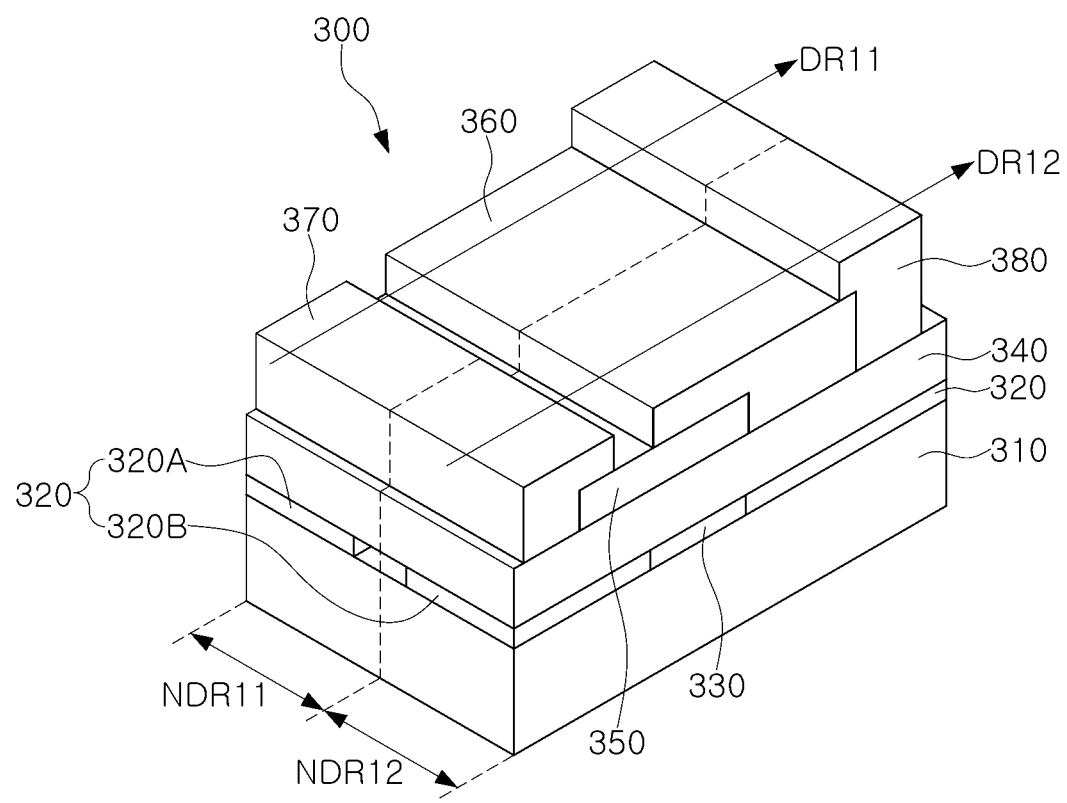
Figure 8:
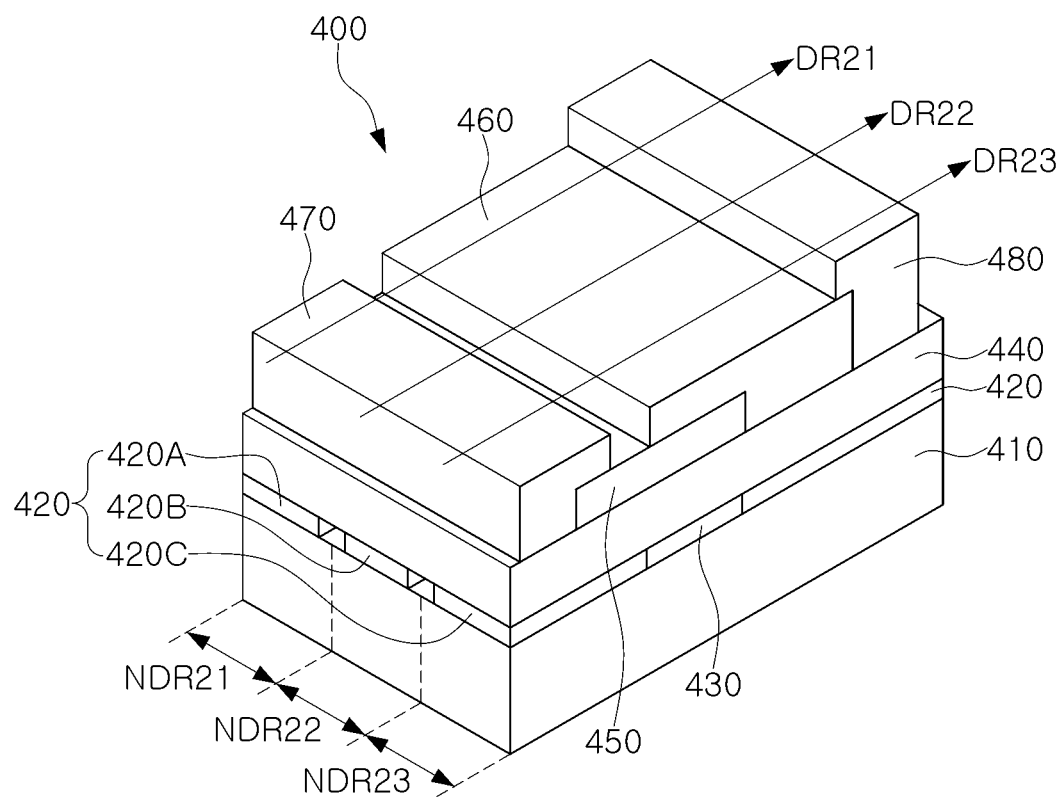

Referring to FIGS. 5 to 8, a negative differential resistance device according to example embodiments is described. FIGS. 5, 7 and 8 are diagrams illustrating various example embodiments of a negative differential resistance device according to some embodiments of the present disclosure. FIG. 6A is a circuit diagram of the negative differential resistance device of FIG. 5, and FIG. 6B is a graph illustrating voltage-current characteristics of the negative differential resistance device of FIG. 5.

In comparison to the negative differential resistance device 100 of the example embodiments previously described, a negative differential resistance device 200 of FIG. 5 is different in that it configures an equivalent circuit to a circuit in which first and second negative differential resistance devices NDR1 and NDR2 are connected in parallel along first and second directions DR1 and DR2 and are electrically connected to a first electrode 270 and a second electrode 280, respectively.

A first dielectric layer 290 may be disposed in the first negative differential resistance device NDR1, and a second dielectric layer 240 and a third electrode 230 may be disposed in the second negative differential resistance device NDR2. Accordingly, as shown in FIG. 6A, the negative differential resistance device 200 may configure an equivalent circuit to a circuit in which the first negative differential resistance device NDR1 and the second negative differential resistance device NDR2 are connected in parallel between the first electrode 270 and the second electrode 280.

As shown in FIG. 6B, a current-voltage characteristic curve G4 of the first negative differential resistance device NDR1 has a fixed value, and a current-voltage characteristic curve G5 of the second negative differential resistance device NDR2 may be shifted in a S3 or S4 direction, depending on a voltage applied to the third electrode 230. That is, the negative differential resistance device 200 of some example embodiments may have the same or similar characteristics as a circuit element in which the first negative differential resistance device NDR1 having a fixed value and the second negative differential resistance device NDR2 having variable values are connected in parallel. A current applied to the negative differential resistance device 200 flows along a region having a relatively lower resistance value, among the first negative differential resistance device NDR1 and the second negative differential resistance device NDR2 connected in parallel. As such, a current-voltage characteristic curve G6 of the negative differential resistance device 200 overall follows a current-voltage characteristic curve connecting the current-voltage characteristic curve G4 of the first negative differential resistance device NDR1 and an upper portion of the current-voltage characteristic curve G5 of the second negative differential resistance device NDR2.

As configurations of the first semiconductor layer 250 and the second semiconductor layer 260, the first to third electrodes 270, 280 and 230, and the insulating layer 220 are the same as those of the previous embodiment, detailed descriptions thereof are omitted to avoid repetition.

A negative differential resistance device may be used to change a logic/memory element into a multi-valued logic circuit or reduce power consumption by reducing a connection wire area. However, the negative differential resistance device having one peak current value and one valley current value has a limitation in increasing a state value of the multi-valued logic circuit. The negative differential resistance device 200 according to example embodiments has the same characteristic as a circuit element in which having a plurality of negative differential resistance devices connected in parallel and thus can provide the current-voltage characteristic curve G6 having the plurality of negative differential resistance areas NDR1 and NDR2, as shown in FIG. 6B. In this regard, the negative differential resistance device 200 of some example embodiments may be used to manufacture a multi-valued logic circuit having more state values than the negative differential resistance device 100 of FIG. 1.

In comparison to the negative differential resistance device 200 of FIG. 5 previously described, a negative differential resistance device 300 of FIG. 7 is similar thereto in that first and second negative differential resistance devices NDR11 and NDR12 of the negative differential resistance device 300 are connected in parallel in first and second directions DR11 and DR12. However, in contrast to the negative differential resistance device 200 of FIG. 5 in which the third electrode 230 is disposed only on the second negative differential resistance device NDR2, the negative differential resistance device 300 of FIG. 7 is different in that a third electrode 330 is disposed on each of the first negative differential resistance device NDR11 and the second negative differential resistance device NDR12. The third electrodes 330 disposed on the first negative differential resistance device NDR11 and the second negative differential resistance device NDR12 may be spaced apart and thus may not be connected to each other. In some example embodiments, in cases in which first and second insulating layers 320A and 320B are respectively disposed in the first negative differential resistance device NDR11 and the second negative differential resistance device NDR12 and spaced apart from each other, but the first and second insulating layers 320A and 320B are not limited thereto. The first and second insulating layers 320A and 320B may be disposed between third electrodes 330 spaced apart from each other such that the third electrodes 330 disposed in the first negative differential resistance device NDR11 and the second negative differential resistance device NDR12 are not connected to each other. As the configurations of the first semiconductor layer 350, the second semiconductor layer 360 and the first to third electrodes 370, 380 and 330 are the same as those described above, detailed descriptions thereof will be omitted to avoid repetition.

In comparison to the negative differential resistance device 300 of FIG. 7 previously described, a negative differential resistance device 400 of FIG. 8 is different in that first to third negative differential resistance devices NDR21, NDR22 and NDR23 are arranged in parallel in first to third directions DR21, DR22 and DR33. In some example embodiments, three negative differential resistance devices NDR21, NDR22 and NDR23 may be disposed in parallel in a single negative differential resistance device 300 but the negative differential resistance is not limited thereto. When the third electrode 330 is divided into n regions in the first to third directions DR21, DR22 and DR33, the same or similar characteristics as the one having n negative differential resistance devices are connected in parallel may be exhibited.

In some example embodiments, first to third insulating layers 420A, 420B and 420C may be disposed on the first to third negative differential resistance devices NDR21, NDR22 and NDR23, respectively, to be spaced apart from each other, but the insulating layers are not limited thereto. The first to third insulating layers 420A, 420B and 420C may be disposed between the third electrodes 430 spaced apart from each other so as not to contact the third electrodes 430 disposed on the first to third negative differential resistance devices NDR21, NDR22 and NDR23. As the configurations of first semiconductor layer 450 and second semiconductor layer 460 and the first to third electrodes 470, 480 and 430 are the same as or similar to those of the previous embodiments, and detailed descriptions thereof will be omitted to avoid repetition.

As set forth above, a negative differential resistance device capable of changing a position of peak current value and a position of the valley current value by controlling the voltage applied to a third electrode layer, which is disposed along with a dielectric layer on a first and second semiconductor layers, is provided.

A plurality of third electrodes arranged in one negative differential resistance device may be arranged to provide a negative differential resistance device having a plurality of peak current values and a plurality of valley current values.

Various advantages and effects of the present disclosure are not limited to the description above, and may be more readily understood in the description of example embodiments in the present disclosure.

While example embodiments have been shown and described above, it will be apparent to those skilled in the art that modifications and variations could be made without departing from the scope of the present invention as defined by the appended claims.

What is claimed is:

1. A negative differential resistance device, comprising:
a conductive substrate;
a dielectric layer comprising a first surface and a second surface opposing the first surface;
a first semiconductor layer comprising a first degenerated layer on the first surface of the dielectric layer and having a first polarity;
a second semiconductor layer comprising a second degenerated layer comprising a region that overlaps the first semiconductor layer and has a second polarity;
a first electrode electrically connected to the first semiconductor layer;
a second electrode electrically connected to the second semiconductor layer;
a third electrode between the second surface of the dielectric layer and the conductive substrate; and
an insulating layer between the second surface of the dielectric layer and the conductive substrate in a region not overlapping the third electrode in a direction perpendicular to the second surface of the dielectric layer,
wherein the first semiconductor layer comprises at least one first material comprising germanium (Ge), a III-V group semiconductor, an organic semiconductor, an oxide semiconductor, a transition metal dichalcogenide, or rhenium disulfide ($ReS_2$),
wherein the second semiconductor layer comprises at least one second material comprising silicon, germanium (Ge), a III-V group semiconductor, an organic semiconductor, an oxide semiconductor, a transition metal dichalcogenide or phosphorene.

2. The negative differential resistance device of claim 1, wherein the third electrode overlaps the first semiconductor layer and is configured to function as a gate electrode that controls the at least one first material, and
wherein the third electrode does not overlap the second semiconductor layer.

3. The negative differential resistance device of claim 1, wherein the third electrode overlaps both the first semiconductor layer and the second semiconductor layer and is configured to function as a gate electrode that controls the at least one first material.

4. The negative differential resistance device of claim 1, wherein the third electrode overlaps the second semiconductor layer and is configured to function as a gate electrode that controls the at least one first material.

5. The negative differential resistance device of claim 1, wherein the third electrode overlaps an entirety of the first semiconductor layer and is configured to function as a gate electrode that controls the at least one first material.

6. The negative differential resistance device of claim 1, wherein the third electrode overlaps an entirety of the second semiconductor layer and is configured to function as a gate electrode that controls the at least one first material.

7. The negative differential resistance device of claim 1, wherein the third electrode overlaps an entirety of the first semiconductor layer and an entirety of the second semiconductor layer and is configured to function as a gate electrode that controls the at least one first material.

8. The negative differential resistance device of claim 1, wherein at least one of the first electrode and the second electrode comprises a region in contact with the dielectric layer.

9. The negative differential resistance device of claim 1, wherein the dielectric layer comprises at least one material of silicon oxide, aluminum oxide, titanium oxide, or hexagonal boron nitride (hBN).

10. The negative differential resistance device of claim 9, wherein the dielectric layer comprises an increased doping concentration based on plasma-treatment of the dielectric layer.

11. A negative differential resistance device, comprising:
a conductive substrate;
a ferroelectric layer comprising a first surface and a second surface opposing the first surface;
a first semiconductor layer comprising a first degenerated layer on the first surface of the ferroelectric layer and has a first polarity;
a second semiconductor layer comprising a second degenerated layer comprising a region that overlaps the first semiconductor layer and has a second polarity;
a first electrode electrically connected to the first semiconductor layer;
a second electrode electrically connected to the second semiconductor layer;
a third electrode between the second surface of the ferroelectric layer and the conductive substrate; and
an insulating layer between the second surface of the ferroelectric layer and the conductive substrate, in a region that does not overlap the third electrode in a direction perpendicular to the second surface of the ferroelectric layer,
wherein the first semiconductor layer comprises at least one first material of germanium (Ge), III-V group semiconductor, organic semiconductor, oxide semiconductor, transition metal dichalcogenide, or rhenium disulfide ($ReS_2$),
wherein the second semiconductor layer comprises at least one second material of silicon, germanium (Ge), III-V group semiconductor, organic semiconductor, oxide semiconductor, transition metal dichalcogenide or phosphorene.

12. The negative differential resistance device of claim 11, wherein the third electrode overlaps the first semiconductor layer and is configured to function as a gate electrode that controls the at least one first material, but does not overlap with second semiconductor layer.

13. The negative differential resistance device of claim 11, wherein the third electrode overlaps both the first semiconductor layer and the second semiconductor layer and is configured to function as a gate electrode that controls the at least one first material.

14. The negative differential resistance device of claim 11, wherein the third electrode overlaps the second semiconductor layer and is configured to function as a gate electrode that controls the at least one first material.

15. The negative differential resistance device of claim 11, wherein the third electrode overlaps an entirety of the first semiconductor layer and is configured to function as a gate electrode that controls the at least one first material.

16. The negative differential resistance device of claim 11, wherein the third electrode overlaps an entirety of the second semiconductor layer and is configured to function as a gate electrode that controls the at least one first material.

17. The negative differential resistance device of claim 11, wherein the third electrode overlaps an entirety of the first semiconductor layer and the second semiconductor layer and is configured to function as a gate electrode that controls the at least one first material.

18. The negative differential resistance device of claim 11, wherein at least one of the first electrode and the second electrode comprises a region in contact with the ferroelectric layer.

19. The negative differential resistance device of claim 11, wherein the ferroelectric layer comprises at least one material of hafnium oxide, hafnium zirconium oxide, zirconium oxide, barium strontium titanium oxide, barium titanium oxide or lead zirconium titanium oxide.

20. The negative differential resistance device of claim 19, wherein the hafnium zirconium oxide includes a material in which zirconium (Zr) is doped in hafnium oxide or a compound of hafnium (Hf), zirconium (Zr) and oxygen (O).

* * * * *